United States Patent
Kim et al.

(10) Patent No.: US 7,427,768 B2
(45) Date of Patent: Sep. 23, 2008

(54) APPARATUS, UNIT AND METHOD FOR TESTING IMAGE SENSOR PACKAGES

(75) Inventors: Young-Seok Kim, Incheon (KR); Hwan-Chul Lee, Incheon (KR); Jae-Cheol Ju, Incheon (KR)

(73) Assignee: Optopac Co., Ltd., Anyang-si (KR)

( * ) Notice: Subject to any disclaimer, the term of this patent is extended or adjusted under 35 U.S.C. 154(b) by 19 days.

(21) Appl. No.: 11/457,771

(22) Filed: Jul. 14, 2006

(65) Prior Publication Data

US 2007/0131881 A1 Jun. 14, 2007

(30) Foreign Application Priority Data

Dec. 12, 2005 (KR) ............ 10-2005-0121803
Dec. 12, 2005 (KR) ............ 10-2005-0121805

(51) Int. Cl.
G01N 21/86 (2006.01)
G01N 21/88 (2006.01)
G01V 8/00 (2006.01)
G01R 31/02 (2006.01)
G01R 31/26 (2006.01)
G01R 31/28 (2006.01)

(52) U.S. Cl. ............ 250/559.45; 324/755; 324/754; 324/158.1; 324/765; 324/760; 250/559.01; 250/559.4

(58) Field of Classification Search ................ 250/559.01–559.49; 324/750–765; 209/571, 209/573; 414/222.01, 222.07, 226.04, 222.09; 356/237.1–237.6, 429–430
See application file for complete search history.

(56) References Cited

U.S. PATENT DOCUMENTS 4,305,097 A * 12/1981 Doemens et al. ............ 348/126

5,150,797 A * 9/1992 Shibata ............ 209/573
5,489,854 A * 2/1996 Buck et al. ............ 324/761

(Continued)

FOREIGN PATENT DOCUMENTS

KR 1020040107881 12/2004

(Continued)

*Primary Examiner*—Georgia Y. Epps
*Assistant Examiner*—Jennifer Bennett
(74) *Attorney, Agent, or Firm*—Marger Johnson & McCollom PC

(57) ABSTRACT

The present invention relates to an apparatus, unit and method for testing image sensor packages, which can automatically test whether the image sensor packages are defective before they are assembled into camera modules. An apparatus for testing image sensor packages according to the present invention comprises a seating unit on which image sensor packages are seated for tests; a testing section having a lens and a light source above the image sensor packages to perform an open and short test and an image test for the image sensor packages; and a controlling and processing unit having a tester module for performing the open and short test and the image test for the image sensor packages. A method for testing image sensor packages according to the present invention comprises the steps of connecting the image sensor packages to a tester module for performing tests for checking whether the image sensor packages are defective; and carrying out an open and short test and an image test for the image sensor packages while irradiating light on the image sensor packages through a lens or blocking the light.

19 Claims, 10 Drawing Sheets

U.S. PATENT DOCUMENTS

| | | | |
|---|---|---|---|
| 5,807,104 A * | 9/1998 | Ikeya et al. | 439/73 |
| 5,865,319 A | 2/1999 | Okuda et al. | |
| 5,957,305 A * | 9/1999 | Takahashi | 209/573 |
| 6,433,294 B1 * | 8/2002 | Nemoto et al. | 209/573 |
| 6,563,331 B1 * | 5/2003 | Maeng | 324/760 |
| 6,617,862 B1 * | 9/2003 | Bruce | 324/752 |
| 6,686,757 B1 * | 2/2004 | Ring et al. | 324/765 |
| 6,747,464 B1 * | 6/2004 | Blackwood | 324/752 |
| 6,765,396 B2 | 7/2004 | Barror | |
| 6,900,888 B2 * | 5/2005 | Yoshida et al. | 356/237.4 |
| 2006/0214673 A1 * | 9/2006 | Tamai | 324/753 |

FOREIGN PATENT DOCUMENTS

| | | |
|---|---|---|
| KR | 1020050063359 | 6/2005 |
| KR | 10-2005-0085408 | 8/2005 |
| KR | 1020050085408 | 8/2005 |
| KR | 10-2005-0101820 | 10/2005 |
| KR | 1020050101819 | 10/2005 |
| KR | 1020050101820 | 10/2005 |
| KR | 580816 * | 5/2006 |

* cited by examiner

APPARATUS, UNIT AND METHOD FOR TESTING IMAGE SENSOR PACKAGES

CROSS-REFERENCE TO RELATED APPLICATIONS

This U.S. non-provisional patent application claims priority under 35 U.S.C. § 119 of Korean Patent Applications 2005-0121803 filed on Dec. 12, 2005 and 2005-0121805 filed Dec. 12, 2005, the entire contents of which are hereby incorporated by reference.

BACKGROUND OF THE INVENTION

1. Field of the Invention

The present invention relates to an apparatus for testing photo-sensing semiconductor devices, and more particularly, to an apparatus, unit and method for testing image sensor packages, which can automatically test whether the image sensor packages are defective before they are assembled into camera modules.

2. Description of the Prior Art

Image sensors are semiconductor devices having the function of photographing images of human beings or objects. The market of these image sensors has been rapidly expanded as they have been loaded into portable phones as well as common digital cameras or camcorders.

Such an image sensor is configured in the form of a camera module and mounted in the aforementioned apparatuses. A camera module comprises a lens, a holder, an infrared (IR) filter, an image sensor, and a printed circuit board. An image is formed by the lens of the camera module, the image formed by the lens is concentrated on the image sensor through the IR filter, and an optical signal of the image is converted into an electrical signal by the image sensor so as to photograph the image.

Among these components, the image sensor for converting an optical signal into an electrical signal is directly mounted as a bare chip on the camera module, or mounted on the camera module after an image sensor chip is packaged.

Among several methods of directly mounting a bare chip of an image sensor on a camera module, a COB (Chip-On board) method which currently occupies 90% or more has problems such as low productivity caused by a unit level packaging scheme, a high defective rate caused by introduction of dust particles during fabrication processes, high investment and maintenance costs of equipment including a clean room having a high degree of cleanness, and limitations on miniaturization. That is, all color filters and micro-lenses are very vulnerable to introduction of dust particles or penetration of moisture because they are fabricated through a photolithographic process after being coated with photoresist. Therefore, according to the COB method, the mounting of the image sensor chip, a wiring operation, the installation of the IR filter, lens and holder, and the like should be carried out in a clean room in which a high degree of cleanness is maintained.

On the contrary, if an image sensor that has been packaged in advance is used, it is possible to solve the aforementioned problems caused when the bare chip is used.

FIG. 1 shows a schematic sectional view of a ceramic leadless chip carrier (CLCC) most frequently used as an image sensor package. In a conventional image sensor package 20 shown in the figure, an image sensor chip 22 is mounted on a ceramic substrate 24 by using epoxy or the like such that the surface thereof faces upward, and the image sensor chip is then covered with a glass cover or glass substrate 21. In order to connect the image sensor chip 22 to the ceramic substrate 24, wires 26 connected to the image sensor chip 22 are connected to connection terminals 27 formed on a floor of the ceramic substrate 24, and the image sensor package 20 is connected to a circuit board by the connection terminals 27.

Another package method is to apply a chip scale package scheme (CSP) to an image sensor chip. This method allows an image sensor chip to be packaged at a wafer level contrary to the chip-on board (COB) method in which an image sensor chip as a bare chip is mounted on a camera module, thereby preventing dust or moisture from penetrating into an image sensing area.

An image sensor package 30 shown in FIG. 2 has been proposed by Schellcase Inc. Specifically, an image sensor chip 32 of which a bottom surface is polished to a thickness of about 100 micrometers is first prepared, an adhesive such as epoxy is coated to form an adhesive layer 34 on a top surface of the image sensor chip with a circuit formed thereon, a glass substrate 31 is then attached to the adhesive layer, an adhesive such as epoxy is then coated to form an adhesive layer 33 on the polished bottom surface, and a glass wafer 35 is then attached to the formed adhesive layer. Then, a dicing blade having a slightly gentle tip angle is used to remove a region between the image sensor chip 32 and the adhesive layer 34, thereby exposing input/output pads of the circuit formed on the top surface of the image sensor chip 32. Further, lateral sides of the image sensor chip 32, adhesive layer 33, and glass wafer 35 are formed to be inclined at a certain angle by using equipment such as a semiconductor wafer cutter (dicing saw). Next, metal wires 36 are formed to extend from the input/output pads of the exposed image sensor chip 32 via the inclined lateral side surfaces to a bottom surface of the glass wafer 35. At this time, the metal wires 36 are formed by forming a metal film from the input/output pads of the exposed image sensor chip 32 via the inclined lateral side surfaces to the bottom surface of the glass wafer 35 and by etching the metal film to form a desired pattern. Finally, connection terminals 37 such as solder balls are formed at ends of the metal wires 36 formed on the bottom surface of the glass wafer 35. The connection terminals 37 will be connected to external terminals or a printed circuit board (PCB). Such an image sensor package available from Shellcase Inc. can be completed to conform to the size of an actual image sensor chip.

As another example of CSP, an image sensor package proposed by the present applicant shown in FIGS. 3 and 4.

The image sensor package 40 of FIG. 3 comprises a glass substrate 41, metal wires 44 formed on the glass substrate 41, an insulating film 45 for protecting the metal wires 44, an image sensor chip 42 electrically connected to the glass substrate 41 by flipchip solder joints 43, and connection terminals 47 such as solder balls formed outside the image sensor chip 42 and connected to a printed circuit board. Meanwhile, a dust-seal layer 46 is formed between the glass substrate 41 and the image sensor chip 42 to prevent foreign substances from being introduced into a space defined between the glass substrate 41 and the image sensor chip 42.

An image sensor package 50 for a camera module shown in FIG. 4 comprises a glass substrate 51, metal wires 54 formed on the glass substrate 51, an insulating film 55 for protecting the metal wires 54, an image sensor chip 52 electrically connected to the glass substrate 51 by flipchip solder joints 53, and passive elements 58 and connection terminals 57 mounted on the metal wires 54 outside the image sensor chip 52. Although the image sensor package 50 shown in FIG. 4 has a structure nearly similar to that of the image sensor package 40 shown in FIG. 3, it has a structure in which the passive elements 58, such as decoupling capacitors, required to construct a camera module can be mounted together on the glass substrate and the connection terminals 57 for connection with a printed circuit board are provided on one surface of the glass substrate. Therefore, in case of such an image sensor package, it is basically possible to eliminate a printed circuit board in fabricating a camera module.

An image sensor package is sold as a single component for use in fabricating a camera module, or at least assembled into a camera module on a different fabrication line. That is, an image sensor package is transferred as a separate component to another line or factory and then mounted on a PCB, a flexible printed circuit (FPC) is then attached to the PCB, and a holder and a lens housing are then installed on the PCB, thereby completing a camera module. At this time, the image sensor package 20, 30, 40 or 50 is electrically connected to the PCB via the connection terminals 27, 37, 47 or 57 formed on the bottom thereof. The holder and the lens housing are installed on the PCB to surround the image sensor package 20, 30, 40 or 50, and an IR filter and a lens are installed in the holder and the lens housing such that they are located on the image sensor package.

Generally, the most critical and frequent defect in a camera module is a defect of an image sensor, which is caused by a defect of an image sensor chip itself or introduction of dust into an image sensing area during a process of packing the image sensor chip. That is, if dust particles are introduced into the image sensor package and then stick on the image sensing area, repeatable defects occur in photographed images. Even though dust particles do not stick on the image sensing area, dust molecules moving in the image sensing area are not acceptable because they may cause defects in a non-repeatable manner. Therefore, introduction of dust particles into a package or contamination of the package should be minimized during the process of packaging an image sensor. This is the reason why a line for manufacturing an image sensor package is managed at a higher degree of cleanness than lines for manufacturing other general packages.

It is known that introduction of moisture into the image sensing area degrades the color filter or micro-lens on the image sensor chip. Of course, since it takes much time for such degradation caused by moisture to appear as deterioration in image quality, it does not generally cause troubles. However, in case of products such as digital cameras for experts, which require no change in image quality for ten years or more, there is a need for a package structure capable of minimizing even the introduction of moisture.

In order to determine a defect of an image sensor itself and a defect caused by introduction of dust particles until a camera module is completed, a testing process is essential. Generally, after sensor manufacturers fabricate image sensor wafers, they perform an open and short test, and a probe test for examining whether each pixel operates properly, and then deliver map files, which show whether the sensor wafers and individual sensor chips are defective, to image sensor package manufacturers or camera module manufacturers.

The image sensor package manufacturers perform packaging of image sensors on the basis of the map files delivered from the sensor manufacturers. At this time, since a defect may be caused in an image sensor package by an error in the packaging process or introduction of dust particles, the image sensor package manufacturers perform tests for respective image sensor packages and then deliver them to the camera module manufacturers.

To complete camera modules, such test processes of determining whether image sensors are defective should also be performed. In this case, a conventional test apparatus is constructed to individually test whether image sensors are defective in the finished camera modules that have been subjected to division into separate PCB units and the process of bonding a connection means such as FPC. Therefore, after one camera module has been tested, it is pulled out manually or automatically. Subsequently, another camera module is manually or automatically seated again at a test position and then tested. Theses test procedures should be repeatedly performed. Since this method inevitably has low throughput per unit time, this becomes a factor that greatly reduces overall productivity of camera modules.

As described above, since the most critical and frequent defect in a camera module is a defect caused by introduction of dust into a pixel area of an image sensor, it is not desirable to perform a test process of determining whether an image sensor is defective after an image sensor package has been already assembled into the camera module. That is, it is desirable to determine whether an image sensor package is defective, before it is assembled into a camera module. However, since conventional apparatuses for testing existing CLCC or CSP made by Shellcase, Inc. have the function of testing whether there is a simple electrical defect by connecting the connection terminals 27 or 37 of the image sensor package 20 or 30 to external terminals and applying an electric current to the terminals, it is impossible to perform an image test that is considered to be most significant by camera module manufacturers.

SUMMARY OF THE INVENTION

Accordingly, the present invention is conceived to solve the aforementioned problems in the prior art. An object of the present invention is to provide an apparatus, unit and method for testing image sensor packages, which can automatically perform an open and short test and an image test for an image sensor package that is a major component of a camera module.

Another object of the present invention is to provide an apparatus, unit and method for testing image sensor packages, which can reduce the number of test processes and time required in a sensor manufacturer or camera module manufacturer by automatically performing an open and short test and an image test for an image sensor package after the image sensor package is manufactured, instead of test processes duplicately performed by the image sensor manufacturer and camera module manufacturer.

According to an aspect of the present invention for achieving the objects, there is provided an apparatus for testing image sensor packages, comprising a seating unit on which image sensor packages are seated for tests; a testing section having a lens and a light source above the image sensor packages to perform an open and short test and an image test for the image sensor packages; and a controlling and processing unit having a tester module for performing the open and short test and the image test for the image sensor packages.

The seating unit may move between a first position where the image sensor packages are to be seated and a second position where the image sensor packages are tested, and the controlling and processing unit may further comprise a handler module for controlling carrying, aligning, and positioning of the image sensor packages.

At this time, the apparatus preferably further comprises a plurality of cassettes on which the image sensor packages are to be loaded, and a carrying unit for carrying the image sensor packages while moving between the cassettes and the seating unit at the first position. Preferably, a plurality of image sensor packages are seated on a tray, and each of the cassettes comprises a cassette body in which the tray is loaded, and an elevator for raising and lowering the tray.

The seating unit preferably comprises a pair of seats on which the image sensor packages are to be seated, and a rotary arm installed rotatably and having the pair of seats disposed at opposite ends thereof, and the image sensor package is preferably carried to the first or second position by means of the rotation of the rotary arm.

The carrying unit may comprise a carrying guide installed to be movable in a right and left direction, a package picker mounting portion mounted on the carrying guide so as to be movable in a fore and aft direction, and a package picker unit mounted on the package picker mounting portion so as to be movable in a vertical direction. Here, the package picker unit comprises a package picker for grasping a sensor. Preferably, a tray picker for grasping an empty tray is mounted on a front surface of the other side of the carrying guide so as to be movable in a vertical direction.

Preferably, the apparatus further comprises an aligning camera for photographing a bottom surface of each of the image sensor packages. The package picker unit may comprise a rotating means for rotating the package picker about a vertical axis.

Connection terminals may be formed at a portion of a bottom surface of each of the image sensor packages, and the seating unit may comprise socket bases on which the image sensor packages are seated to be electrically connected thereto.

Preferably, the apparatus further comprises a lower supporting die; an upper supporting die disposed to be spaced apart by a predetermined distance above the lower supporting die and to face the lower supporting die and having the light source at a bottom surface thereof, a socket cover that is mounted on the bottom surface of the upper supporting die so as to be movable in a vertical direction, is moved downwardly to press the top of the socket base, and has the lens; and a connecting plate that is mounted on a top surface of the lower supporting die so as to be movable in the vertical direction, supports the socket bases, and has lower pogo pins at the top thereof. Each of the socket bases preferably comprises a socket body; a seating plate that is installed to be movable in the vertical direction with respect to the socket body and has a top surface on which each of the image sensor packages is to be seated and a plurality of vertically formed through-holes; a resilient member for resiliently biasing the seating plate upwardly; upper pogo pins that are installed through the socket body and inserted into the through-holes of the seating plate so that one ends thereof protrude upwardly upon downward movement of the seating plate and are then connected to the connection terminals of the image sensor packages; and a socket printed circuit board that has top and bottom surfaces respectively formed with upper contact pads brought into contact with lower ends of the upper pogo pins and lower contact pads connected to the upper contact pads and brought into contact with the lower pogo pins provided in the connecting plate and is attached to a bottom surface of the socket body.

According to another aspect of the present invention, there is provided a method for testing image sensor packages, comprising the steps of connecting the image sensor packages to a tester module for performing tests for checking whether the image sensor packages are defective; and carrying out an open and short test and an image test for the image sensor packages while irradiating light on the image sensor packages through a lens or blocking the light.

The method may comprise the step of sorting the image sensor packages into defective packages, good packages, and packages to be retested, after the step of carrying out the tests.

Preferably, the method further comprises the steps of seating each of the image sensor packages on a socket base at a first position, and carrying the socket base from the first position to a second position. The step of connecting the image sensor packages to the tester module is preferably performed at the second position.

Preferably, the method further comprises the step of carrying the socket base back to the first position after the step of carrying out the tests. The tested image sensor packages are sorted at the first position.

According to a further aspect of the present invention, there is provided a unit for testing image sensor packages, comprising a light source provided above the image sensor packages; a lens provided between the light source and the image sensor packages; and socket bases on which the image sensor packages are seated for an open and short test and an image test and to which the image sensor packages are electrically connected.

Each of the socket bases may comprise a socket body; a seating plate that is installed to be movable in a vertical direction with respect to the socket body and has a top surface on which each of the image sensor packages is to be seated; a resilient member for resiliently biasing the seating plate upwardly; and connecting members that are installed in the socket body so that one ends thereof protrude upwardly upon downward movement of the seating plate and are then connected to connection terminals formed in a portion on a bottom surface of each of the image sensor packages.

Each of the connecting members preferably comprises a pogo pin having resilient opposite ends so that its length can be extendable.

Preferably, the socket body includes a concave portion with an open top, the seating plate includes a plurality of through-holes formed vertically therethrough and is located in the concave portion, and the connecting members are inserted into the through-holes of the seating plate.

The seating plate preferably includes a recess with an open top on which the image sensor package is seated, and a package supporting portion that is brought into contact with and supports another portion on the bottom surface of the image sensor package. At this time, the package supporting portion preferably has a convex portion or a concave portion formed on the bottom surface of the seating plate. Alternatively, the package supporting portion may include at least one of a slope formed at an upper lateral side of the recess and a peripheral portion of the recess at the top of the seating plate.

The unit for testing image sensor packages may further comprising a lower supporting die for supporting the socket base; an upper supporting die disposed to be spaced apart by a predetermined distance above the lower supporting die and to face the lower supporting die; and a socket cover that is mounted on a bottom surface of the upper supporting die so as to be movable in a vertical direction and is moved downwardly to press the top of the socket base. At this time, it is preferred that the light source be provided on the bottom surface of the upper supporting die, the socket cover be formed with a vertical through-hole, and a lens be provided in the through-hole.

Preferably, a socket printed circuit board having top and bottom surfaces respectively formed with mutually connected upper and lower contact pads is attached to a bottom surface of the socket body, the socket body is formed with through-holes into which the connecting members are inserted so that lower ends of the connecting members are brought into contact with the upper contact pads, and the lower contact pads are brought into contact with contact members provided on the lower supporting die. Here, the lower supporting die may include a connecting plate on which the contact members are installed and which is mounted on a top surface of the lower supporting die so as to be movable in a vertical direction so that upper ends of the contact members can be brought into contact with the lower contact pads when the connecting plate is moved upwardly. Further, each of the connecting members preferably comprises a pogo pin having resilient opposite ends so that its length can be extendable.

BRIEF DESCRIPTION OF THE DRAWINGS

The above and other objects, features and advantages of the present invention will become apparent from the following description of a preferred embodiment given in conjunction with the accompanying drawings, in which.

DETAILED DESCRIPTION OF THE PREFERRED EMBODIMENT

Hereinafter, a preferred embodiment of the present invention will be described with reference with the accompanying drawings.

Figure 5:
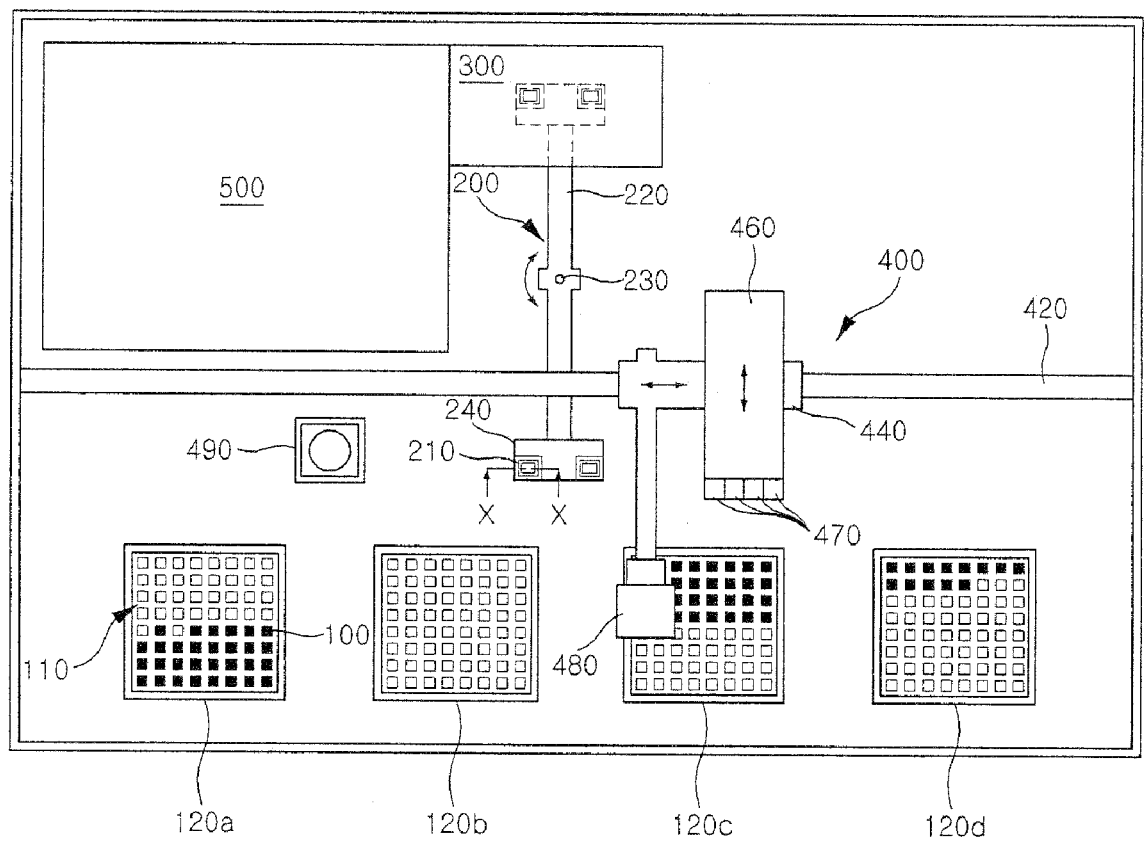
FIG. 5 is a plan view schematically showing the configuration of an apparatus for testing image sensor packages according to an embodiment of the present invention.
Figure 6:
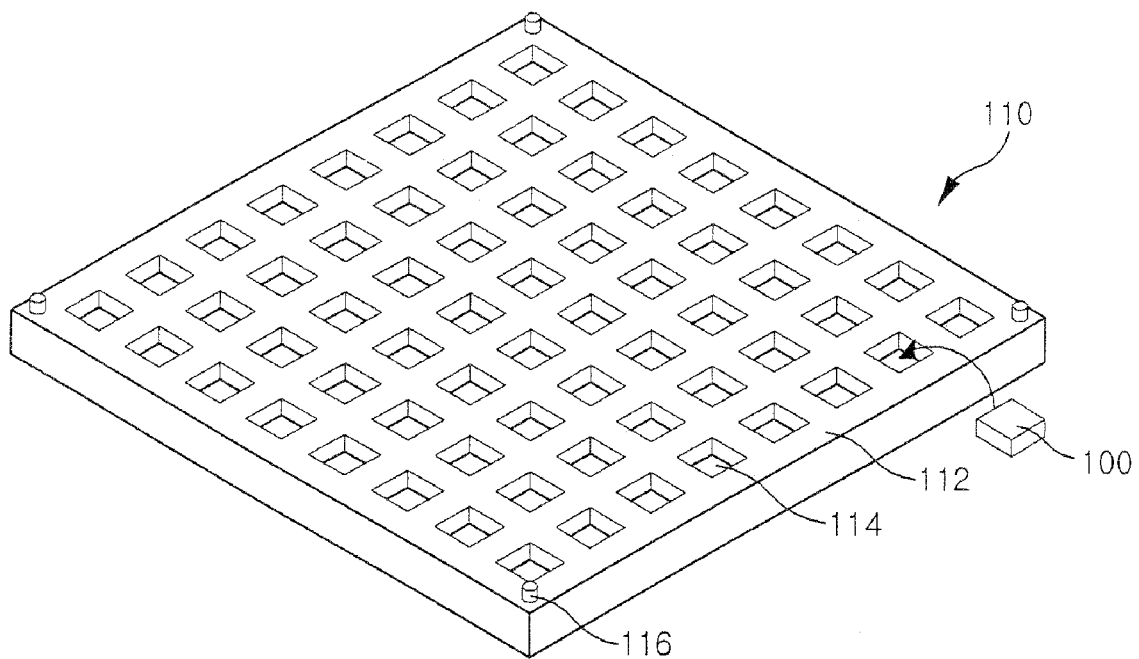
FIG. 6 shows a tray for loading a plurality of image sensor packages on the apparatus for testing image sensor packages according to the present invention.
Figure 7:
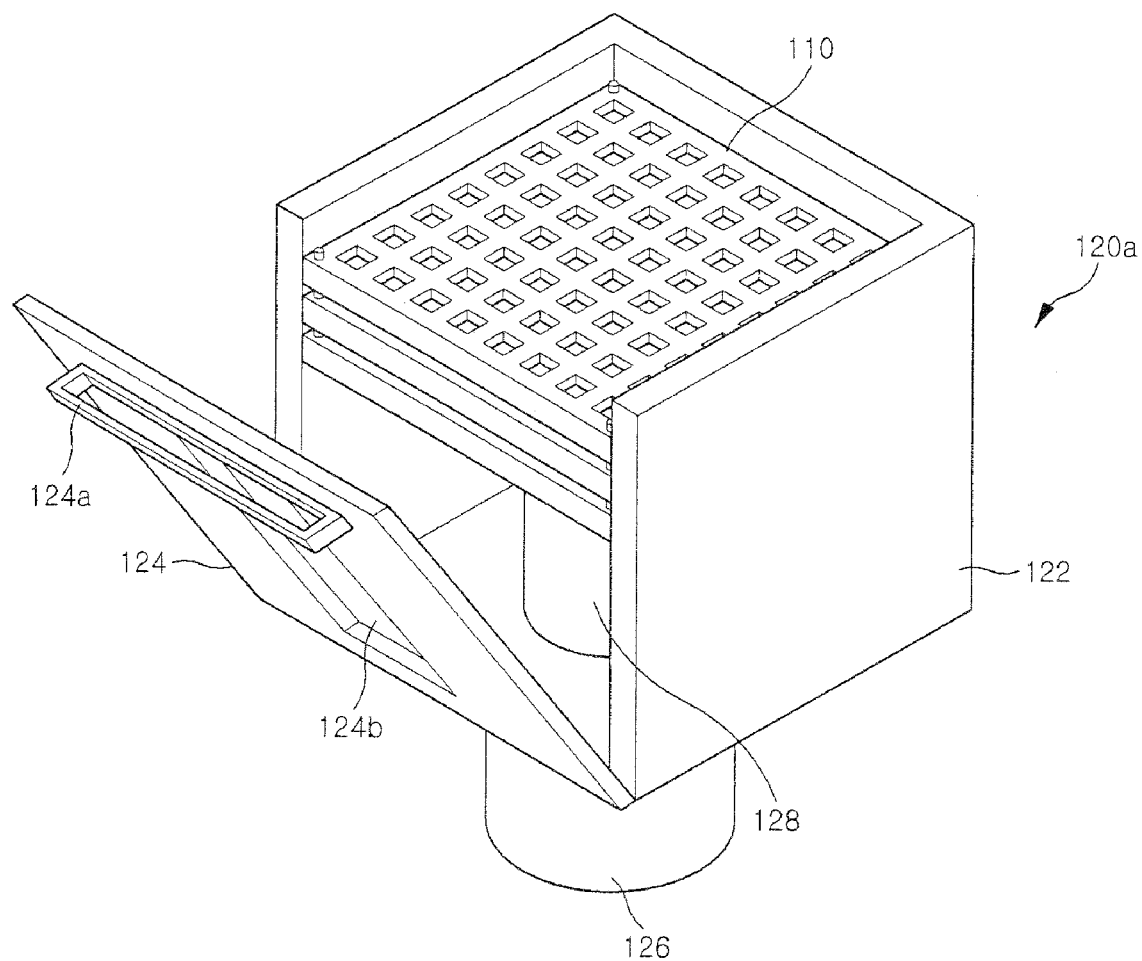
FIG. 7 is a perspective view of a cassette with the tray loaded thereon.
Figure 8A:
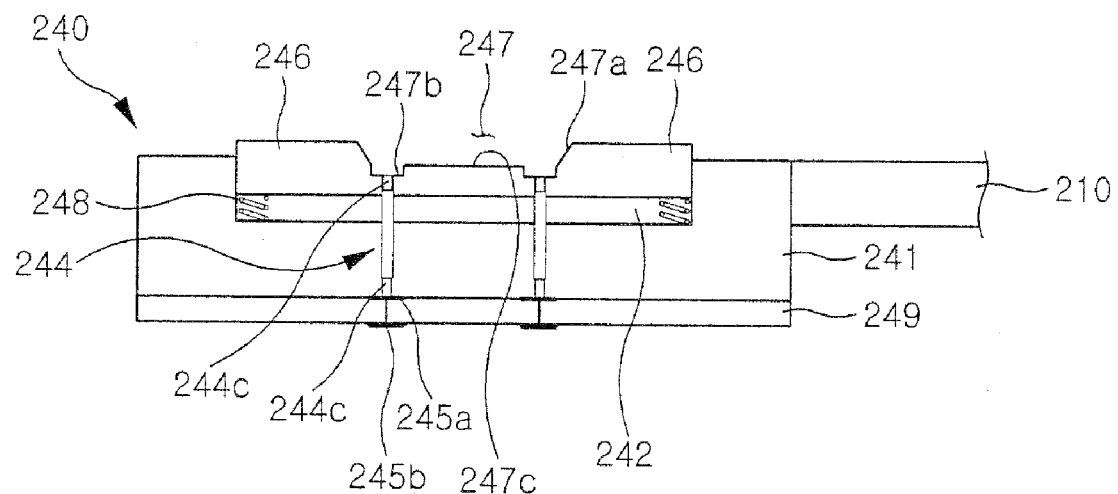
FIGS. 8A and 8B are enlarged sectional views taken along line X-X of FIG. 5, showing a socket base on which an image sensor package is to be seated.
Figure 8B:
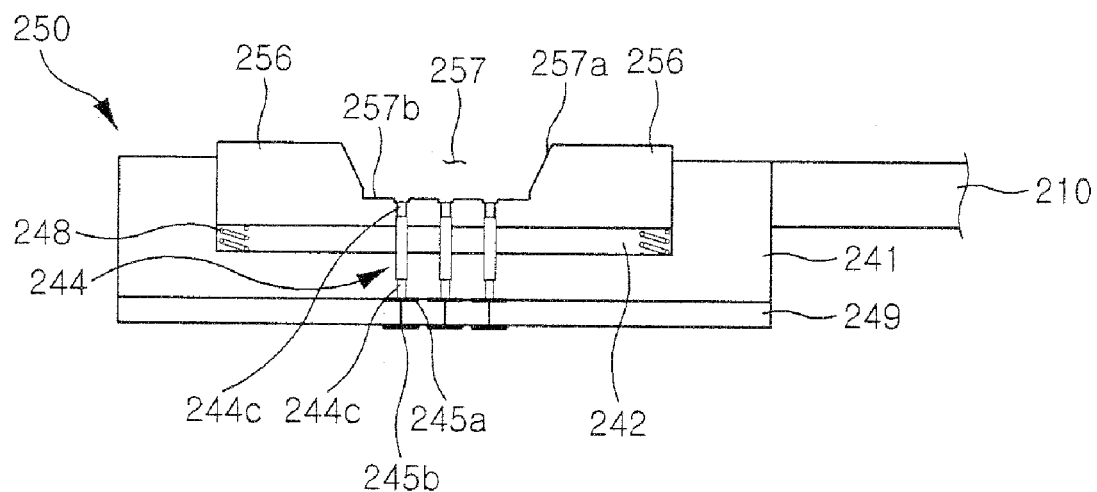
Figure 9:
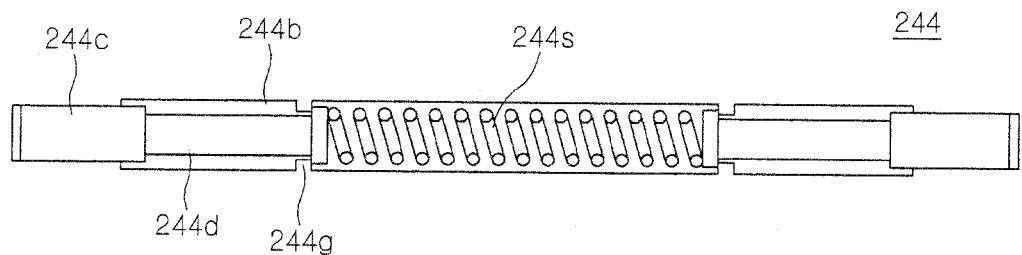
FIG. 9 is a sectional view of a pogo pin to be mounted on the socket base shown in FIGS. 8A and 8B.
Figure 10:
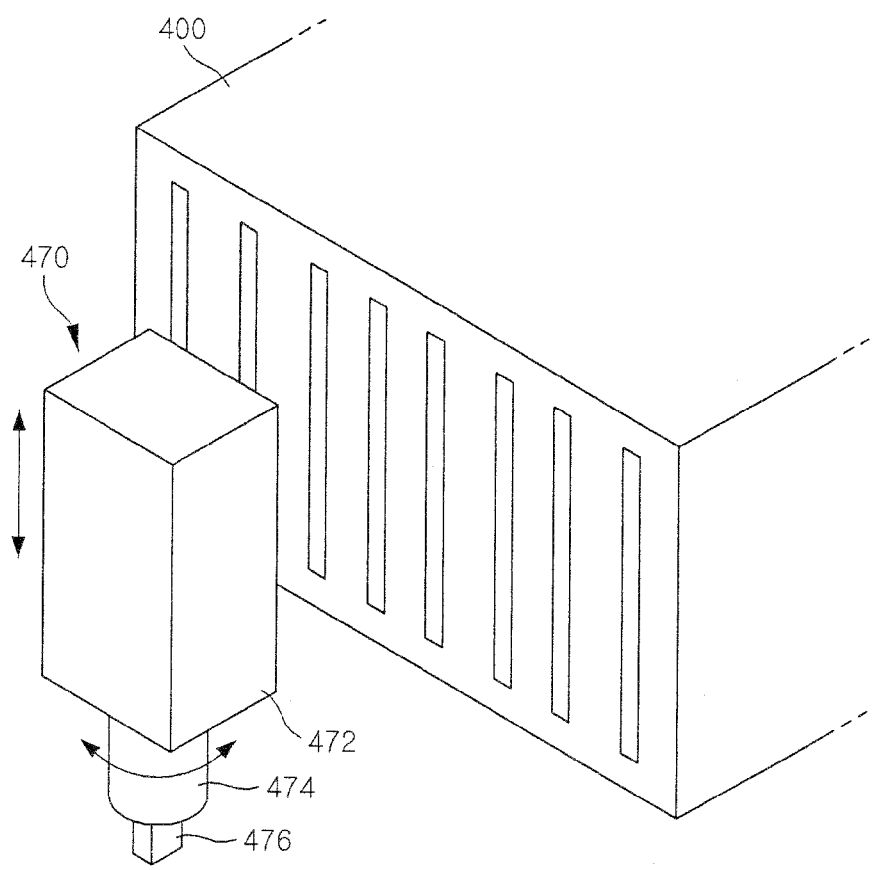
FIG. 10 is a perspective view showing that one of package picker units for carrying image sensor packages is mounted in front of a package picker mounting section.
Figure 11:
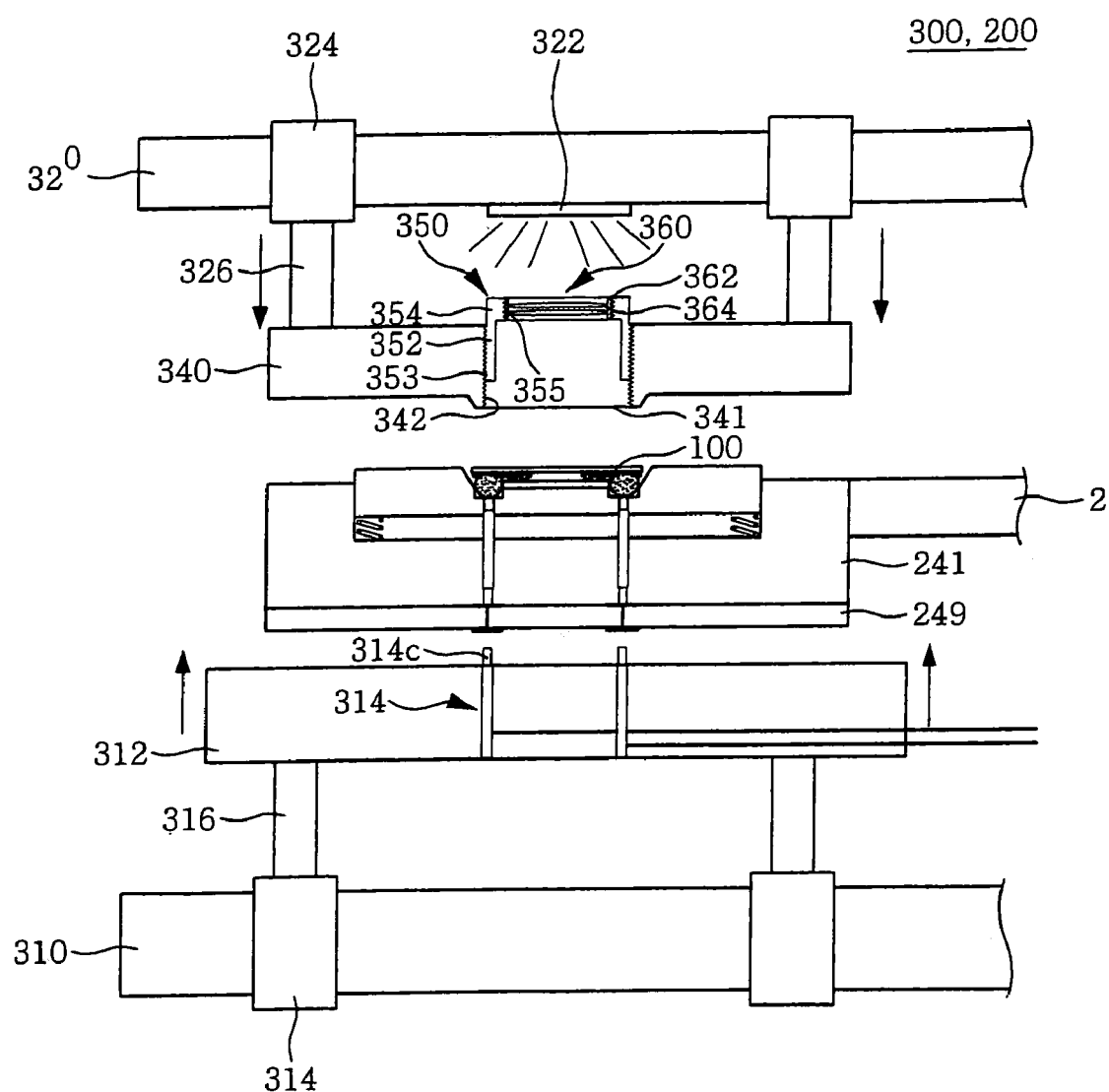
FIG. 11 is a sectional view of a testing section when viewed from the rear of the apparatus for testing image sensor packages according to the present invention.
Figure 12A:
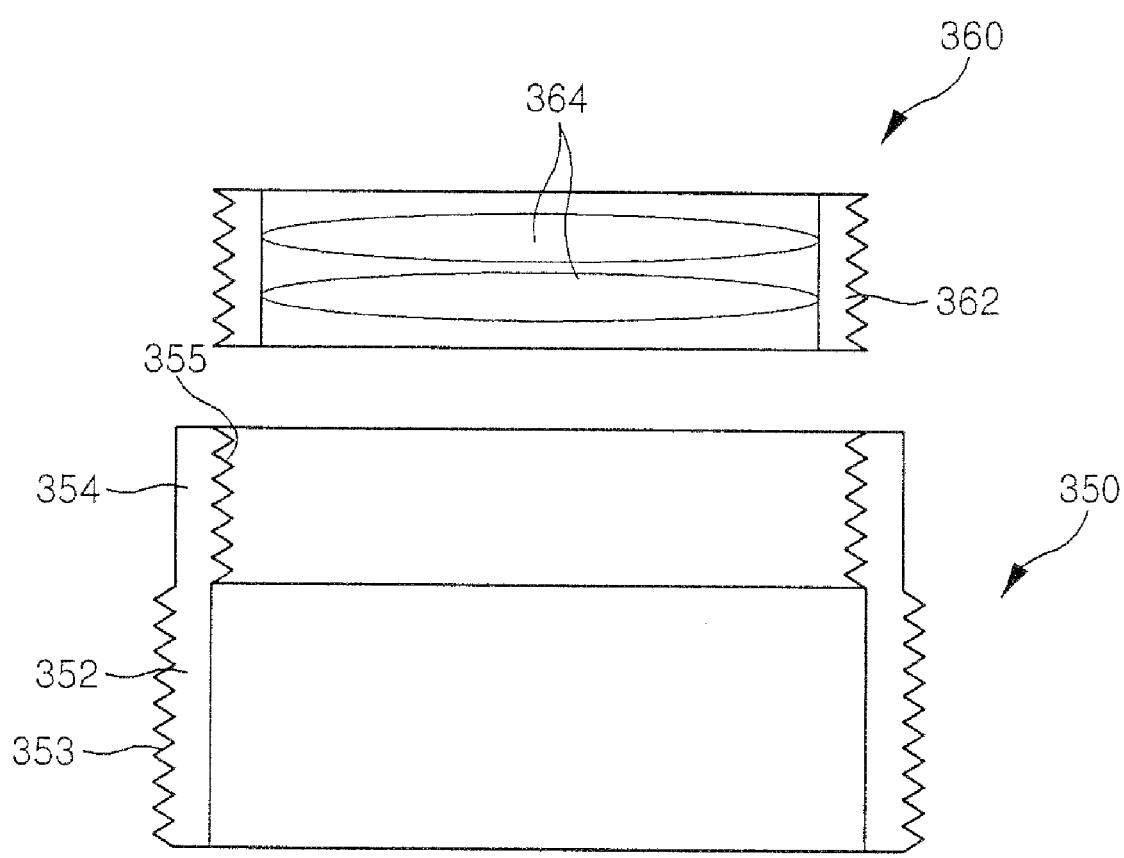
FIGS. 12A and 12B are a sectional view and a perspective view of a lens adaptor, respectively.
Figure 12B:
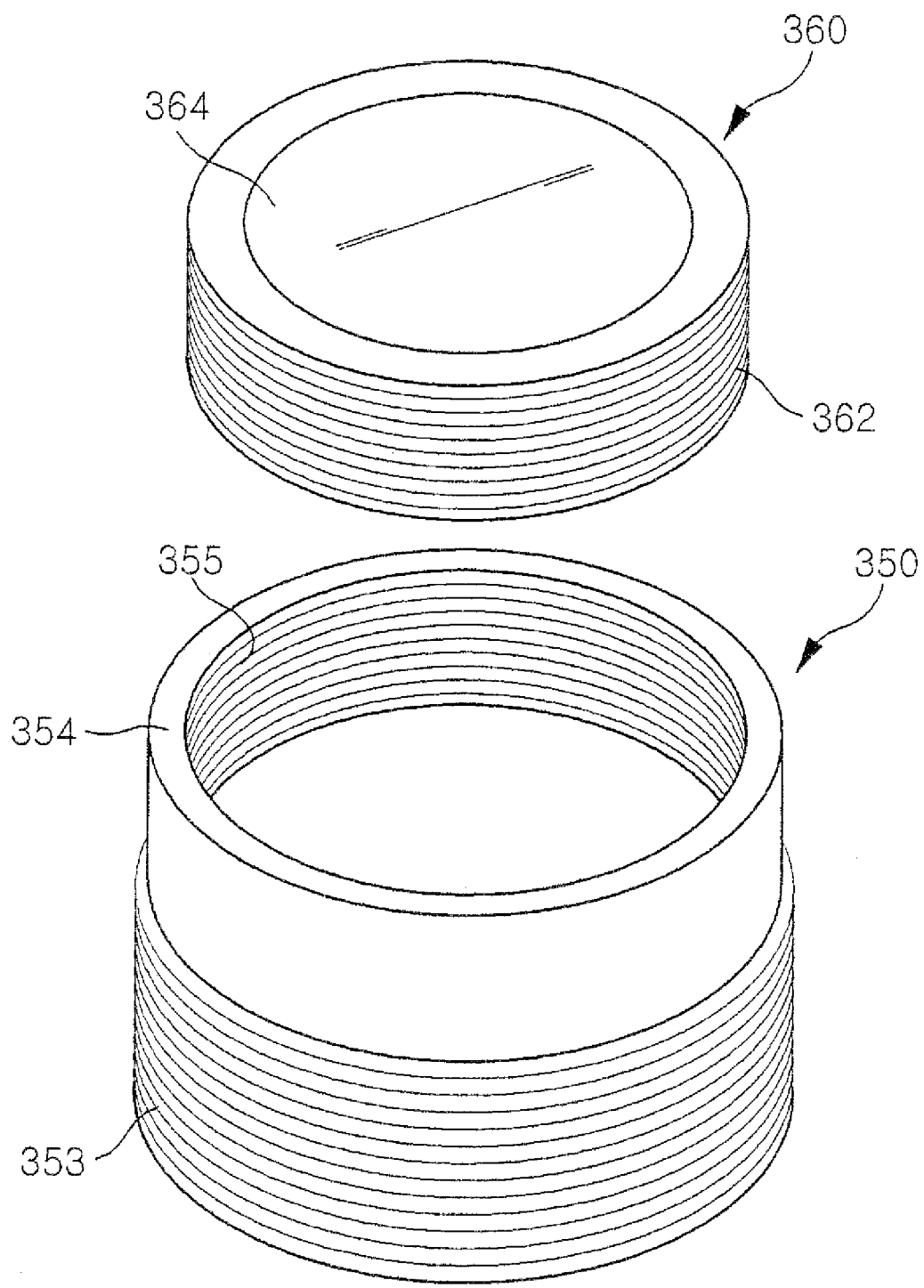

FIG. 5 is a plan view schematically showing the configuration of an apparatus for testing image sensor packages according to an embodiment of the present invention; FIG. 6 shows a tray for loading a plurality of image sensor packages on the apparatus for testing image sensor packages according to the present invention; FIG. 7 is a perspective view of a cassette with the tray loaded thereon; FIGS. 8A and 8B are enlarged sectional views taken along line X-X of FIG. 5, showing a socket base on which an image sensor package is to be seated; FIG. 9 is a sectional view of a pogo pin to be mounted on the socket base shown in FIGS. 8A and 8B; FIG. 10 is a perspective view showing that one of package picker units for carrying image sensor packages is mounted in front of a package picker mounting section; FIG. 11 is a sectional view of a testing section when viewed from the rear of the apparatus for testing image sensor packages according to the present invention; and FIGS. 12A and 12B are a sectional view and a perspective view of a lens adaptor, respectively.

Referring to FIG. 5, the apparatus for testing image sensor packages according to the present invention comprises a plurality of cassettes 120a to 120d loaded with a plurality of trays 110 on which image sensor packages 100 before and after being subjected to tests are to be seated; a seating unit 200 on which the image sensor packages 100 are to be seated for tests; a testing section 300 for performing an open and short test and an image test for the image sensor packages 100 seated on the seating unit 200; a carrying unit 400 for carrying the image sensor packages 100 between the trays 110 loaded on the cassettes 120a to 120d and the seating unit 200; and a controlling and processing unit 500 in which a handler unit responsible for the control function of carrying, aligning and positioning the image sensor packages is combined with an image sensor package tester module responsible for the open and short test and the image test for the image sensor packages.

Figure 3:
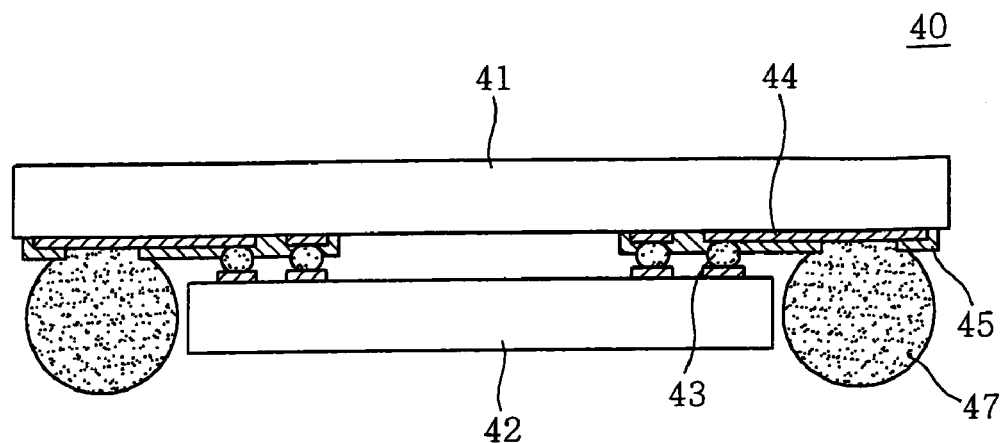
Figure 4:
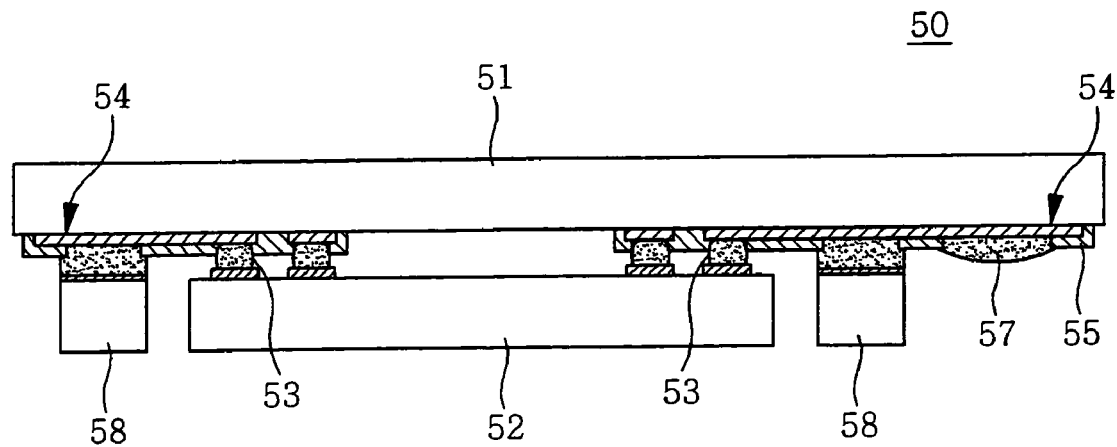

The image sensor packages 100 include image sensor packages that are packaged at a wafer level, i.e., packaged using the CSP scheme described in "Description of the Prior Art." In particular, an image sensor package having a bottom surface formed with connection terminals connected to input/output pads of an image sensor chip, for example, the image sensor package 20, 30, 40 or 50 described in "Description of the Prior Art," is preferably applied to the apparatus for testing image sensor packages according to the present invention. Therefore, since the image sensor packages 100 to be tested by the apparatus for testing image sensor packages according to the present invention have a configuration similar to that of the aforementioned conventional image sensor package 20, 30, 40 or 50, a detailed description thereof will be omitted herein. Hereinafter, the image sensor packages will be described using reference numeral 100. However, if the image sensor packages 20 and 30 used in the CLCC and the CSP of Shellcase Inc. shown in FIGS. 1 and 2 should be distinguished from the image sensor packages 40 and 50 which are shown in FIGS. 3 and 4 and proposed by the present applicant, reference numeral 20, 30, 40 or 50 will be used for an image sensor.

Each of the trays 110 is a member for loading a plurality of image sensor packages 100 to the apparatus for testing image sensor packages according to the present invention. Referring to FIG. 6, the tray 110 is configured such that a plurality of rectangular recesses 114 are arranged in a matrix form in a plate-shaped tray body 112. The rectangular recesses 114 are formed to have a shape such that an image sensor package 100 can be seated therein. Since several trays 110 are stacked within each of the cassettes 120a to 120d, a plurality of projections 116 protrude from respective corners on a top surface (or bottom surface) of the tray body 112 in order to allow the stacked trays 110 to be spaced apart from one another. As can be easily understood by those skilled in the art, the tray body may be provided with convexities, concavities, or a combination of convexities and concavities for alignment of the trays 110. Further, concave portions (not shown) having a shape corresponding to that of tips of the projections 116 are preferably formed in the bottom surface (or top surface) of the tray body 112 so that upper and lower trays 110 can be easily aligned with each other when the trays 110 are stacked. Although there is no limitation on the number of rectangular recesses 114 formed in the tray body 112, the tray 110 used in the present embodiment has a total of sixty four recesses 114, i.e., eight rows of recesses arranged in a horizontal direction and eight columns of recesses arranged in a vertical direction.

In the embodiment of the present invention, the first to fourth cassettes 120a to 120d are arranged in a line in front of the apparatus for testing image sensor packages. The first cassette 120a is a cassette for loading trays 110 on which a plurality of image sensor packages 100 to be tested are seated, and the second cassette 120b is a cassette for loading empty trays 110 without an image sensor package 100. Empty trays 100 are loaded to the third and fourth cassettes 120c and 120d. Thereafter, among the image sensor packages 100 which have been tested, good packages are put on the trays 100 loaded to the third cassette 120c, and defective packages are put on the trays 100 loaded to the fourth cassette 120d. Since the cassettes 120a to 120d have the same configuration, the configuration thereof will be described by way of example in connection with the cassette 120a.

Referring to FIG. 7 that is a perspective view showing the first cassette 120a with a door thereof opened, the first cassette 120a comprises a cassette body 122 in the form of a rectangular hexahedron of which at least top and bottom faces are open, and a door 124 for opening and closing a front face of the cassette body 122. A front surface of the door 124 is formed with a handle 124a for facilitating opening and closing of the door, and a window 124b for use in checking the interior of the cassette body 122. A predetermined space is defined within the cassette body 122 so that the aforementioned trays 110 can be stacked and loaded therein. Moreover, an elevator for raising and lowering the stacked and loaded trays 110 is provided at a lower portion of the cassette body 122. The elevator comprises a cylinder 126 provided at the lower portion of the cassette body 122; and an elevating shaft 128 which extends to the interior of the cassette body 122 through the bottom of the cassette body 122 and has an upper end which supports the bottom surface of the tray 110. In this case, the upper end of the elevating shaft 128 preferably takes the shape of a plate so that it can stably support the bottom surface of the tray 110.

Referring back to FIG. 5, the seating unit 200 on which the image sensor packages 100 are to be seated for tests comprises a pair of seats 210, a rotary arm 220 having the pair of seats 210 disposed at opposite ends thereof, a rotating shaft 230 provided at the center of the rotary arm 220, and a motor (not shown) which drives the rotating shaft to rotate the rotary arm 220. A pair of socket bases 240 is detachably or integrally mounted on the seats 210, respectively, which are disposed at the both ends of the rotary arm 220.

The rotary arm 220 extends in a fore and aft direction (up and down in FIG. 5) in the apparatus for testing image sensor packages so that the seats 210 disposed at the both ends of the rotary arm can be positioned in the front and rear of the apparatus, respectively. In this case, the rotary arm 220 is reciprocally rotated by 180 degrees about the rotating shaft 230 provided at the center thereof by means of the motor. Accordingly, the front and rear positions of the seats 210 are interchanged.

Referring to FIG. 8A showing a socket base 240 to which the image sensor package 40 shown in FIG. 3 is applied, the socket base 240 comprises a socket body 241 formed with a concave portion 242 having an open top face and formed with through-holes; a plurality of upper pogo pins 244 as connection members which are fitted into the through-holes to be disposed upwardly and are electrically connected to the image sensor package 40; a seating plate 246 inserted into the concave portion 242 so as to be movable up and down with respect to the socket body 241; a plurality of resilient members 248 such as springs which are interposed between the socket body 241 and the seating plate 246; and a socket printed circuit board 249 attached to a bottom surface of the socket body 241.

The seating plate 246 is formed with a recess 247 which has an open top and on which the image sensor package 40 is to be seated. The recess 247 has a size and shape corresponding to those of the image sensor package 40, and has a slope 247a at its upper lateral side. This makes a mouth of the recess 247 a little larger than the image sensor package 40, thereby serving to guide the image sensor package 40 into the recess 247 such that the package can be seated in the recess. The seating plate 246 is also formed with a plurality of vertical through-holes into which the upper pogo pins 244 are inserted so that the upper pogo pins are exposed to a floor surface 247b of the seating plate 246. In particular, the center of the floor surface 247b of the seating plate 246 is formed with an upwardly protruding block-shaped package supporting portion 247c which comes into contact with and supports the bottom surface of the image sensor package 40.

Furthermore, upper contact pads 245a are formed at positions on a top surface of the socket printed circuit board 249 corresponding to the through-holes of the socket body 241, and lower contact pads 245b connected to the upper contact pads 245a are formed on a bottom surface of the socket printed circuit board 249.

Moreover, the pogo pins 244 that are connection members installed in the socket base 240 have extendable resilient opposite ends. Referring first to FIG. 9, each pogo pin 244 comprises a hollow pipe-shaped pogo pin body 244b with opposite open ends, contacts 244c partially inserted into the opposite ends of the pogo pin body 244b, and a spring 244s interposed between the contacts 244c within the pogo pin body 244b. A smaller diameter portion 244d which has a diameter smaller than that of the opposite ends of the pogo pin body is formed between the contacts 244c. A groove 244g is formed at the periphery of the pogo pin body 244b such that the inner diameter of the pogo pin body 244b becomes smaller, thereby limiting movement of the contacts 244c. Such an upper pogo pin 244 retracts or extends in length while the contacts 244c enter and leave the pogo pin body 244b with predetermined resilience.

When the image sensor package 40 is seated on the socket base 240 configured as such, specifically, on the seating plate 246, the bottom surface of the image sensor chip 42 of the image sensor package 40 is first brought into contact with the seating plate. The resilient member 248 provided between the bottom surface of the seating plate 246 and a floor surface of the concave portion 242 biases the seating plate 246 upwardly. When the image sensor package 40 has been seated on the seating plate 246, the bottom surface of the image sensor chip 42 which are located higher than the connection terminals 47 of the image sensor package 40 is put on the package supporting portion 247c of the seating plate 246. At this time, the connection terminals 47 are still spaced apart from the upper contacts 244c of the upper pogo pins 244. Thereafter, when the image sensor package 40 is pressed downwardly by a socket cover 340 to be described below, the upper contacts 244c of the upper pogo pins 244 protrude upwardly of the floor surface 247b of the seating plate 246 while the seating plate 246 descends, resulting in connection of the image sensor package 40 to the connection terminals 47. At this time, since the upper contacts 244c of the upper pogo pin 244 are resiliently engaged with the pogo pin body 244b, a predetermined resilient force exists between the upper contacts and the connection terminals 47, and accordingly, a constant contact force is maintained therebetween.

At this time, the lower contacts 244c of the upper pogo pins 244 are brought into contact with the upper contact pads 245a formed on the top surface of the socket printed circuit board 249. Accordingly, the connection terminals 47 of the image sensor package 40 are electrically connected to the lower contact pads 245b which are formed on the bottom surface of the socket printed circuit board 249 and connected to the upper contact pads 245a. The lower contact pads 245b are electrically connected to the controlling and processing unit 500 via lower pogo pins 314 that are contact members installed on a lower supporting die 310 to be described below.

Figure 1:
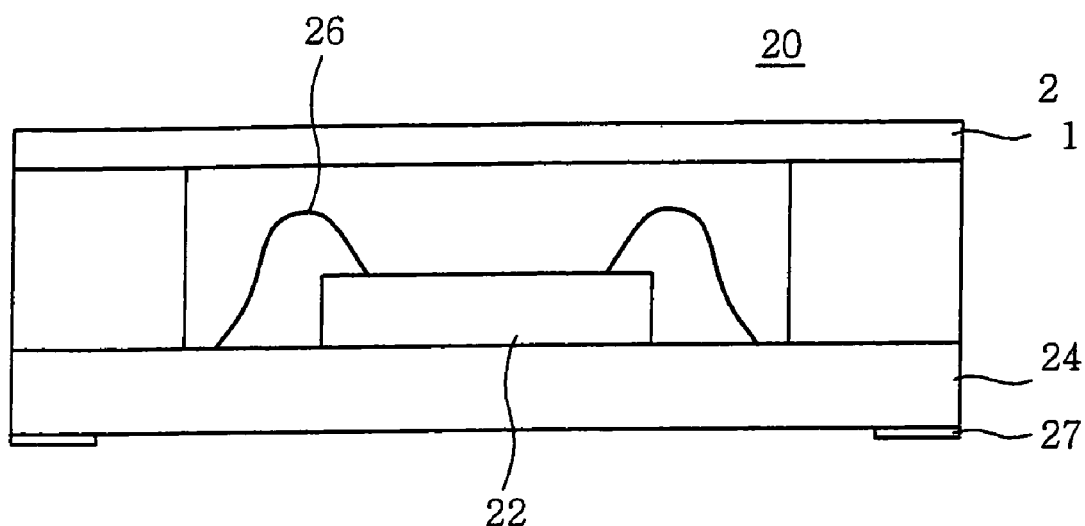
FIGS. 1 to 4 are schematic sectional views of various kinds of conventional image sensor packages.

The socket base 240 having the shape shown in FIG. 5A can also be applied to the image sensor packages 20 and 50 shown in FIGS. 1 and 4 by adjusting the position of the upper pogo pins 244 and the height of the package supporting portion 247c. This is particularly because the package supporting portion 247c is formed to correspond to a difference in height between the bottom surface of the image sensor package 40 and the connection terminals 47. For instance, application of the image sensor packages 20 and 50 shown in FIGS. 1 and 4 to the socket base 240 requires to position the upper pogo pins 244 below the connection terminals 27 and 57, and to form the package supporting portion 247c into a substantially flat shape in case of the image sensor package 20 of FIG. 1, or to form the packing supporting portion 247c into a concave shape so that it can receive the image sensor chip 52 and the passive elements 58 in case of the image sensor package 50 of FIG. 4.

Figure 2:
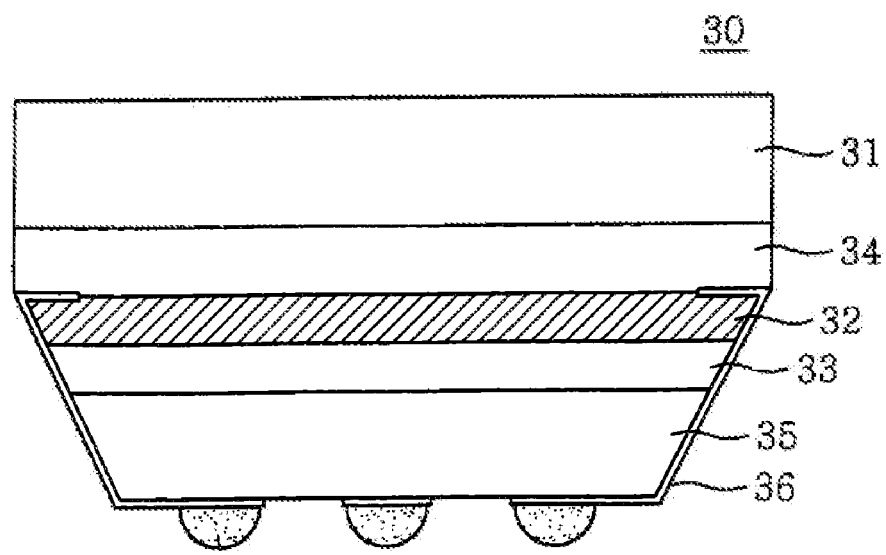

FIG. 8B shows a socket base 250 which uses the image sensor package 30 shown in FIG. 2 as the image sensor package 100. In this case, the socket base 250 is the same as the socket base 240 shown in FIG. 8A in view of their configurations and operations except that the upper pogo pins 244 are formed at the center of the concave portion 242 and the shape of a seating plate 256 is slightly different from the seating plate 246 of FIG. 8A. A slope 257a which is formed at a peripheral portion and/or an upper lateral side of a recess 257 in a top surface of the seating plate 256 also functions as the package supporting portion which comes into contact with and supports the adhesive layer 34 defining the bottom surface of the image sensor package 30, and/or the inclined lateral side surface on which the metal wires 36 are formed. Therefore, when the image sensor package 30 is seated on the seating plate 256, the adhesive layer 34 of the image sensor package 30 and/or the inclined lateral side surface formed with the metal wires 36 are first brought into contact with the peripheral portion of the recess 257 in the top surface of the seating plate 256 and the slope 257a of the concave portion 252, respectively. The socket base 250 is the same as the socket base 240 shown in FIG. 8A in view of other configurations and operations.

Next, the carrying unit 400 is provided between the first to fourth cassettes 120a to 120d and a front socket base of the socket bases 240 respectively provided at the opposite ends of the rotary arm 220, which is located at the front end of the rotary arm 220, thereby carrying an image sensor package 100 therebetween. Referring back to FIG. 5, the carrying unit 400 comprises a carrying guide rail 420 which extends transversely such that opposite ends of the rail are fixed to right and left walls of the apparatus for testing image sensor packages according to the present invention; a carrying guide 440 which is mounted on the carrying guide rail 420 to move transversely along the rail; a package picker mounting portion 460 mounted at one side of the carrying guide 440 so as to be movable in the fore and aft direction; and a plurality of picker units 470 mounted on a front surface of the package picker mounting portion 460 so as to be movable in a vertical direction.

Referring to FIG. 10, each package picker unit 470 comprises a package picker body 472 mounted on the front surface of the package picker mounting portion 460 so as to be movable in the vertical direction; a rotating shaft 474 mounted on a bottom surface of the package picker body 472 so as to be rotatable about a vertical axis; and a package picker 476 mounted on a bottom surface of the rotating shaft 474. The package picker 476 is a part that actually grasps an image sensor package 100. In this embodiment, the package picker grasps an image sensor package 100 by using vacuum suction.

That is, the package picker mounting portion 460 is movable in the fore and aft direction on the carrying guide 440 which moves transversely, i.e., in the right and left direction, on the carrying guide rail 420. The package picker unit 470 with the package picker 476 installed thereon is movable perpendicularly to the package picker mounting portion 460. Therefore, the package picker 476 is movable in the right and left direction, in the fore and aft direction and in the vertical direction within the apparatus for testing image sensor packages according to the present invention. Further, since the package picker 476 is mounted on the rotating shaft 474 which rotates about the vertical axis, the package picker can also rotate about the vertical axis by a motor (not shown) provided within the package picker body 472.

An upwardly facing aligning camera 490 is fixedly installed at a position adjacent to the socket base 240 located at the front end of the rotary arm 220 with respect to the rotating shaft 230, for instance, on the left (or on the right) of the socket base. The aligning camera 490 photographs a bottom surface of an image sensor package 100 lifted by the package picker 476, and then transmits a signal of a photographed image to the controlling and processing unit 500. The controlling and processing unit 500 having the function of a handler module analyses the signal of the photographed image of the image sensor package 100, and recognizes the oriented and aligned state of a sensor. Thereafter, if the image sensor package 100 is misaligned, the orientation of the image sensor package 100 is aligned by rotating the rotating shaft 474 by means of a motor. This alignment is performed to exactly seat the image sensor package 100 on the seating plate 246 of the socket base 240.

Meanwhile, the other side of the carrying guide 440 extends forward, and a tray picker 480 is mounted on a front surface of the other side so as to be movable in the vertical direction. The tray picker 480 serves to grasp and move an empty tray within a cassette while the tray picker is moved in the right and left direction and in the vertical direction between the first to fourth cassettes 120a to 120d by the carrying guide 440. The tray picker 480 can grasp the tray 110 using vacuum suction or clamps.

In the apparatus for testing image sensor packages according to the present invention including the carrying unit 400, the configurations of driving parts, such as motors and hydraulic or pneumatic cylinders, for transverse movement, back and forth movement, and vertical movement, and rotation about the vertical axis are well known in the related art. Thus, descriptions of the configurations and operational relationship will be omitted herein.

When an image sensor package 100 in the first cassette 120a is put on the seating plate 246 of the socket base 240 located at the front end of the rotary arm 220 with respect to the rotating shaft 230, the rotary arm 220 is rotated by 180 degrees to move the socket base 240 and the image sensor package 100 seated thereon to the testing section 300.

Under cooperation between the carried socket base 240 and the testing section 300, the image sensor package 100 is subjected to an open and short test and an image test. Therefore, the socket base 240 together with the testing section 300 constitutes a single unit for testing image sensor packages.

As shown in FIG. 11, the testing section 300 comprises lower and upper supporting dies 310 and 320 which are disposed to be vertically spaced apart by a predetermined distance from each other while facing each other; a connecting plate 312 mounted on a top surface of the lower supporting die 310 so as to be movable in a vertical direction therefrom; and a socket cover 340 mounted on a bottom surface of the upper supporting die 320 so as to be movable in the vertical direction therefrom.

The upper supporting die 320 is provided with one or more cylinders 314 and both ends of the connecting plate 312 are fixed to tips of pistons 316 of the cylinders so that operations of the cylinders 314 cause the connecting plate 312 to move in a vertical direction. When the socket base 240 is located between the connecting plate 312 and the socket cover 340, the lower pogo pins 314 are installed at positions corresponding to the lower contact pads 245b of the socket printed circuit board 249. In particular, the lower pogo pins 314 are installed such that the upped contacts 314c thereof protrude from the top face of the connecting plate 312. Similarly to the aforementioned upper pogo pins 244, the upper contacts 314c of the lower pogo pins 314 also move resiliently with respect to the bodies of the lower pogo pins 314. Accordingly, when the operations of the cylinders 314 moves the connecting plate 312 which in turn comes into contact with and supports the bottom surface of the socket base 240, the lower pogo pins 314 and the lower contact pads 245b are resiliently brought into contact with each other, and thus, the connection therebetween is kept constant.

The upper supporting die 320 is provided with at least one or more cylinders 324 and both ends of the socket cover 340 are fixed to tips of pistons 326 of the cylinders 324 so that operations of the cylinders 324 cause the socket cover 340 to move in the vertical direction. The center of the socket cover 340 is formed with a through-hole 342 for adaptor engagement. A lens adaptor 350 is fitted into the through-hole 342, and the lens adaptor 350 is mounted with a lens section 360 including a lens housing 362 and lenses 364 fixed in the lens housing 362. Further, a light source 322 is installed in the upper supporting die 320 above the socket cover 340 to provide light required for an image test for an image sensor package 100. As for the light source 322, an incandescent electric lamp, a white LED and the like can be used.

Referring to FIGS. 12A to 12B, the lens adaptor 350 comprises first and second hollow cylindrical diameter portions 352 and 354, wherein the first diameter portion 352 has an outer diameter 353 corresponding to the inner diameter of the through-hole 342, and the second diameter portion 354 has an inner diameter 355 corresponding to the outer diameter of the lens housing 362. Therefore, one side of the lens adaptor 350 is fixedly mounted to the socket cover 340, and other side thereof is fixedly mounted to the lens section 360. This lens adaptor 350 is provided to mount various kinds of lenses to the socket cover 340.

Since lens sections for use in ordinary camera modules have different diameters, the lens section 360 is installed in the socket cover 340 via the lens adaptor 350 instead of preparation of a socket cover corresponding to an individual lens section, in order to adapt lens sections with different diameters to the socket cover 340. Therefore, even though a lens optimized for the image sensor package 100 has an outer diameter different from the inner diameter of the through-hole 342, the lens can be mounted to the socket cover 340 by preparing a plurality of lens adaptors 350 of which the outer diameters 353 of the first diameter portions 352 are identical with one another but the inner diameters 355 of the second diameter portions 354 are different from one another.

The outer diameter 353 of the first diameter portion 352 and the inner diameter of the through-hole 342 are formed with complementary male and female threads, respectively, and the inner diameter 355 of the second diameter portion 354 and the outer diameter of the lens housing 362 are formed with complementary female and male threads, thereby facilitating engagement therebetween. Moreover, since these portions are threadly engaged with each other, the focus of the lens section 360 can be adjusted by rotating one of the threaded portions to adjust the distance between the image sensor package 100 and the lens section 360.

The lens adaptor 350 shown in FIGS. 12A and 12B is applied to a case where the outer diameter 360 of the lens section 360 is smaller than the inner diameter of the through-hole 342. On the contrary, if the outer diameter of the lens section is greater than the inner diameter of the through-hole 342, the inner diameter of the second diameter portion 354 can be made greater than the outer diameter of the first diameter portion 352.

Naturally, the outer diameter 353 of the first diameter portion 352, the inner diameter of the through-hole 342, the inner diameter 355 of the second diameter portion 354 and the outer diameter of the lens housing 362 may not be formed with threads but may be fitted into one another or fixed to one another by means of other means.

To ensure a precise image test in the apparatus for testing image sensor packages according to the present invention, lenses optimized for image sensor packages 100 should be used to perform evaluation. Therefore, since lenses to be used are different depending on image sensor packages 100 to be tested, replacement of a lens is required if an image sensor package 100 to be tested is changed. Meanwhile, such a lens adaptor is preferably made of materials such as plastics.

The controlling and processing unit 500 is a combination of a handler module responsible for carrying, aligning and positioning image sensor packages and a tester module responsible for an open and short test and an image test for image sensor packages. Specifically, the handler module controls operations of the elevators installed in the cassettes 120a to 120d, the rotary arm 220, the carrying unit 400, the connecting plate 312, the socket cover 340 and the like. The tester module controls ON/OFF of the light source 322, applies a predetermined reference voltage and current to the upper pogo pins 244 of the socket base 240, receives and processes a resultant output signal for an image sensor package 100 to determines whether the image sensor package 100 is defective, and receives a signal from the aligning camera 490 to perform image processing for the image sensor package 100. While the handler module and the tester module communicate with each other as mentioned above, the handler module causes the carrying unit to carry the image sensor package to a predetermined position and to perform alignment thereof, depending on determination results of the tester module on whether the image sensor package 100 is defective and aligned.

As tests for the image sensor package 100 performed in the apparatus for testing image sensor packages according to the present invention, both tests including the open and short test and the image test are performed.

In the open and short test, current and power approval tests are performed in which a predetermined current and voltage is applied to input/out pads via connection terminals of an image sensor package 100, a resultant output value is compared with an initial set value, and it is determined whether the image sensor package is defective based on the degree of difference between the output value and the initial set value.

In the image test, it is determined whether an image sensor package 100 is defective based on the presence or absence of a black spot or a stain on an image photographed by the image sensor package, similarly to tests for display devices such as ordinary LCDs. As in the aforementioned testing section 300, the tests are performed while an image sensor package 100 to be tested is irradiated with a predetermined quantity of light from the light source 322 provided above the image sensor package. At this time, a lens section 360 optimized for the image sensor package 100 is located between the image sensor package 100 and the light source 322 via the lens adaptor 350. The tester module in the controlling and processing unit 500 processes an output image signal for the image sensor package 100 and determines whether there is any physical or electrical trouble, which obstructs traveling of light, in the image sensor package 100 into which light has been converged. Items detected by the apparatus for testing image sensor packages according to the present invention include a dead pixel, line noise, RGB abnormality and the like, which are similar to those in ordinary display devices. Image tests performed by the apparatus for testing image sensor packages according to the present invention include a darkroom test, a color integration test, a test for checking a central position of a lens, a screen division (central portion/edge) test, a pixel defect test, a horizontal line defect test, a vertical line defect test, a stain presence/absence test, a shading defect check, a bit missing test, and the like.

Next, the process of testing whether an image sensor package 100 is defective, using the apparatus for testing image sensor packages according to the present invention will be described.

First, as shown in FIGS. 1 to 6, image sensor packages 100 each of which has connection terminals formed on the bottom of a sensor are seated in the rectangular recesses 114 of the trays 110. The door 124 of the first cassette 120a is opened, and the plurality of trays 110 are then loaded and stacked in the first cassette 120a. At this time, the elevating shaft 128 within the first cassette 120a is in a state where it is lowered to a lowermost position. When the door 124 is closed after all the trays 110 are loaded, the elevating shaft 128 is raised to a proper position. At this time, the second cassette 120b is in an empty state without a tray 110, and the third and fourth cassettes 120c and 120d are loaded with empty trays 110 and have the elevating shafts 128 raised to a proper position.

Thereafter, the carrying section moves the package picker 476 to the first cassette 120a to lift an image sensor package 100 to be tested. At this time, two package pickers 476 can lift two image sensor packages 100 one by one so that the apparatus for testing image sensor packages can test the two image sensor packages 100 at a time. When the package picker 476 lifts the image sensor package 100 and then moves such that the image sensor package is placed above the aligning camera 490, the aligning camera 490 photographs the image sensor package 100 lifted by the package picker 476 and then sends an image signal to the controlling and processing unit 500. The controlling and processing unit 500 analyses the image signal of the photographed image sensor package 100 and recognizes the oriented and aligned state of the sensor. At this time, if the image sensor package 100 is misaligned, the motor rotates the rotating shaft 474 to align the orientation of the image sensor package 100.

Then, the carrying section moves the package picker 476 to the socket base 240 located at the front end of the rotary arm 220 with respect to the rotary shaft 230, and causes the image sensor package 100 to be seated on the seating plate 246 of the socket base 240. At this time, if two package pickers 476 have lifted two image sensor packages 100 one by one, the image sensor packages 100 can be seated one by one on a pair of juxtaposed socket bases 240. When the image sensor package 100 is seated in the recess 247 of the seating plate 246, the rotary arm 220 of the seating unit 200 is rotated by 180 degrees, and thus, the socket base 240 on which the image sensor package 100 is seated moves from the front end of the rotary arm 220 to the rear end thereof, i.e., to the testing section 300.

The socket base 240 moved to the testing section 300 is located between the upper and lower supporting dies 310 and 320, as shown in FIG. 11. Thereafter, the cylinders 314 of the lower supporting die 310 operate to move the connecting plate 312 upwardly, so that the connecting plate 312 comes into contact with and supports the socket printed circuit board 249 of the socket base 240. At this time, the lower pogo pins 314 installed on the connecting plate 312 and the lower contact pads 245b of the socket printed circuit board 249 are resiliently brought into contact with each other, and thus, the connection therebetween is kept constant. Thereafter, the cylinders 324 of the upper supporting die 320 push the pistons 326 so as to lower the socket cover 340. When the socket cover 340 is lowered, a pressing surface 341 formed to protrude from the bottom surface of the socket cover 340 presses the top of the image sensor package 100 so as to lower the image sensor package 100 together with the seating plate 246 on which the image sensor package is seated. When the seating plate 246 is lowered, as mentioned above, the upper contacts 244c of the upper pogo pins 244 protrude upwardly of the floor surface 247c of the recess 247 and then are connected to the connection terminals formed on the bottom of the image sensor package 100. At this time, the lower contacts 244c of the upper pogo pins 244c are also brought into contact with the upper contact pads 245a of the socket printed circuit board 249 and then electrically connected to the controlling and processing unit 500 via the lower contact pads 245b and the lower pogo pins 314.

The controlling and processing unit 500 applies a predetermined voltage and current to the image sensor package 100 to perform an open and short test. Further, the image sensor package 100 receives light emitted from the light source 322 located thereabove, and transmits a resultant image signal to the controlling and processing unit 500 to perform an image test. Even at this time, if image sensor packages 100 are seated on a pair of juxtaposed socket bases 240, respectively, the tests for the image sensor packages are simultaneously performed in one testing section 300.

As such, while the image sensor package 100 is tested in the testing section 300 located behind the rotating shaft 230, the carrying unit 400 seats an image sensor package 100 to be tested on the socket base 240 located at the front end of the rotary arm 220. When the test for the image sensor package 100 is completed, the rotary arm 220 of the seating unit 200 is rotated again by 180 degrees to carry the socket base 240 located in the rear testing section 300 back to the front and to carry the front socket base 240 on which the image sensor package 100 to be tested is seated to the rear so that the image sensor package to be tested can be subjected to such a test.

When the tester module of the controlling and processing unit 500 has completed the open and short test and the image test for the image sensor package 100 and has determined whether the image sensor package is defective, the tester module transmits a test result signal to the handler module so that the handler module of the controlling and processing unit 500 causes the package picker 476 to move the tested image sensor package 100 to a predetermined position according to the determination results. That is, the hander module controls the package picker 476 through communication between the tester module and the handler module in the controlling and processing unit 500, so that the package picker sorts and carries the image sensor package 100, which has been tested and carried to the front, to the third or fourth cassette 120*c* or 120*d* depending on whether the image sensor package is defective. Accordingly, the image sensor package 100 is seated in an empty rectangular recess 114 of a tray 110 loaded in the third or fourth cassette 120*c* or 120*d*. At this time, the rotary arm 220 is preferably rotated in a direction opposite to the direction when the socket base 240 is carried from the front end of the rotary arm to the rear end thereof. This is because a second wire (not shown) extending from the socket base 240 to the controlling and processing unit 500 is prevented from being wound on the rotating shaft 230.

When such test processes are repeated, all the image sensor packages 110 of the tray 110 located at the uppermost layer in the first cassette 120*a* are tested. Then, when the tray becomes empty, the tray picker 480 lifts the empty tray 110 and transfers it to the second transfer 120*b*, and the elevator of the first cassette 120*a* is raised for preparation of tests for image sensor packages 100 seated on the next tray. Further, when a tray 110 located at the uppermost layer in the third or fourth cassette 120*c* or 120*d* is full of image sensor packages 100, the elevator of the third or fourth cassette 120*c* or 120*d* is lowered, and the tray picker 480 loads the empty tray 110 of the second cassette 120*b* into the third or fourth cassette 120*c* or 120*d*.

Meanwhile, since the apparatus for testing image sensor packages according to the present invention performs various tests, in addition to the open and short test, including a darkroom test, a color integration test, a test for checking a central position of a lens, a screen division (central portion/edge) test, a pixel defect test, a horizontal line defect test, a vertical line defect test, a stain presence/absence test, a shading defect check, a bit missing test and the like, as the image test, it may be unreasonable to sort image sensor packages into two kinds of packages, i.e., defective packages and good packages, even though the importance of each of these test items is taken into consideration, i.e., even though a different weighting factor is given to each test item. Therefore, in the apparatus for testing image sensor packages according to the present invention, tested image sensor packages may be sorted into three kinds of packages, i.e., defective packages, packages to be retested, and good packages by setting a proper boundary range between the defective and good packages. The packages to be retested may be sorted again into packages for individual retests, such as a darkroom test, a color integration test and a test for checking a central position of a lens. To this end, at least one additional tray for a retest should be provided, and accordingly, the test module should perform control such that the handler module handles the package picker 476 according to the results of the retest. Meanwhile, as for image sensor packages sorted to be subjected to a retest, an inspector reexamines the test results or performs a retest so as to determine whether the image sensor packages are defective.

Although the present invention has been described with reference to the drawings and the illustrative embodiment, it will be understood by those skilled in the art that the present invention can be variously modified and changed without departing from the spirit and scope of the present invention defined by the appended claims.

For example, although the rotary arm is rod-shaped and the socket bases are mounted at the opposite ends of the rotary arm in the aforementioned embodiment, it is also possible to employ a rotary arm constructed in such a manner that two rotary arms each of which is identical with the rotary arm of the embodiment are placed in parallel and then connected by a connecting member at central portions thereof. If such an H-shaped rotary arm is mounted with socket bases at its four ends, respectively, and a rotating shaft installed at the center of the connecting member is rotated, much more image sensor packages can be tested at a time as compared with the aforementioned embodiment.

Further, although the seating dies 210 are respectively provided at the both ends of the rotary arm 220 in this embodiment, they may be installed within the testing section 300. In this case, the carrying unit 400 should carry image sensor packages 100 while it moves between the cassettes 120*a* to 120*d* and the testing section 300.

In the apparatus for testing image sensor packages according to the present invention constructed as above, it is possible to perform an image test as well as an open and short test for image sensor packages before they are assembled into camera modules. Accordingly, since it can be determined whether image sensor packages are defective before being assembled into camera modules, the yield of camera modules can be increased.

In particular, since the image test can be performed with a lens optimized for each image sensor package, the image test can be performed more accurately even at a packaging stage of an image sensor before it is assembled into a camera module.

What is claimed is:

1. A unit for testing image sensor packages, comprising:
a light source provided above the image sensor packages;
a lens provided between the light source and the image sensor packages; and
socket bases on which the image sensor packages are seated for an open and short test and an image test and to which the image sensor packages are electrically connected;
a lower supporting die for supporting the socket base;
an upper supporting die disposed to be spaced apart by a predetermined distance above the lower supporting die and to face the lower supporting die; and
a socket cover that is mounted on a bottom surface of the upper supporting die so as to be movable in a vertical direction and is moved downwardly to press the top of the socket base.

2. The unit as claimed in claim 1, wherein each of the socket bases comprises a socket body; a seating plate that is installed to be movable in a vertical direction with respect to the socket body and has a top surface on which each of the image sensor packages is to be seated; a resilient member for resiliently biasing the seating plate upwardly; and connecting members that are installed in the socket body so that one ends thereof protrude upwardly upon downward movement of the seating plate and are then connected to connection terminals formed in a portion on a bottom surface of each of the image sensor packages.

3. The unit as claimed in claim 2, wherein each of the connecting members comprises a pogo pin having resilient opposite ends so that its length can be extendable.

4. The unit as claimed in claim 2, wherein the socket body includes a concave portion with an open top, the seating plate includes a plurality of through-holes formed vertically therethrough and is located in the concave portion, and the connecting members are inserted into the through-holes of the seating plate.

5. The unit as claimed in claim 4, wherein the seating plate includes a recess with an open top on which the image sensor package is seated, and a package supporting portion that is brought into contact with and supports another portion on the bottom surface of the image sensor package.

6. The unit as claimed in claim 5, wherein the package supporting portion has a convex portion or a concave portion formed on the bottom surface of the seating plate.

7. The unit as claimed in claim 5, wherein the package supporting portion includes at least one of a slope formed at an upper lateral side of the recess and a peripheral portion of the recess at the top of the seating plate.

8. The unit as claimed in claim 2, wherein the light source is provided on the bottom surface of the upper supporting die, the socket cover is formed with a vertical through-hole, and a lens is provided in the through-hole.

9. The unit as claimed in claim 2, wherein a socket printed circuit board having top and bottom surfaces respectively formed with mutually connected upper and lower contact pads is attached to a bottom surface of the socket body, the socket body is formed with through-holes into which the connecting members are inserted so that lower ends of the connecting members are brought into contact with the upper contact pads, and the lower contact pads are brought into contact with contact members provided on the lower supporting die.

10. The unit as claimed in claim 2, wherein the lower supporting die includes a connecting plate on which the contact members are installed and which is mounted on a top surface of the lower supporting die so as to be movable in a vertical direction so that upper ends of the contact members can be brought into contact with the lower contact pads when the connecting plate is moved upwardly.

11. The unit as claimed in claim 10, wherein each of the connecting members comprises a pogo pin having resilient opposite ends so that its length can be extendable.

12. An apparatus for testing image sensor packages, comprising:
a seating unit on which the image sensor packages are seated for tests;
a testing section adapted to perform an image test by illuminating the sensor packages using a lens and a light source provided above the image sensor packages, and adapted to perform an open and short test by supplying current and voltage to the image sensor packages; and
a controlling and processing unit including a handler module and a tester module, wherein the handler module is adapted to control a carrying, aligning and positioning of the image sensor packages,
the tester module is adapted to supply current and voltage to the testing section for tests, receive an output signal of the image sensor packages to determine if the image sensor packages are electrically defective, control the light source, and receive an output image from the testing section to determine if the image sensor packages have defective images, and
a lower supporting die; an upper supporting die disposed to be spaced apart by a predetermined distance above the lower supporting die and to face the lower supporting die and having the light source at a bottom surface thereof; a socket cover that is mounted on the bottom surface of the upper supporting die so as to be movable in a vertical direction, is moved downwardly to press the top of the socket base, and has the lens; and a connecting plate that is mounted on a top surface of the lower supporting die so as to be movable in the vertical direction, supports the socket bases, and has lower pogo pins at the top thereof, wherein each of the socket bases comprises a socket body; a seating plate that is installed to be movable in the vertical direction with respect to the socket body and has a top surface on which each of the image sensor packages is to be seated and a plurality of vertically formed through-holes; a resilient member for resiliently biasing the seating plate upwardly; upper pogo pins that are installed through the socket body and inserted into the through-holes of the seating plate so that one ends thereof protrude upwardly upon downward movement of the seating plate and are then connected to the connection terminals of the image sensor packages; and a socket printed circuit board that has top and bottom surfaces respectively formed with upper contact pads brought into contact with lower ends of the upper pogo pins and lower contact pads connected to the upper contact pads and brought into contact with the lower pogo pins provided in the connecting plate and is attached to a bottom surface of the socket body,
wherein connection terminals are formed at a portion of a bottom surface of each of the image sensor packages, and the seating unit comprises socket bases on which the image sensor packages are seated to be electrically connected thereto.

13. The apparatus as claimed in claim 12, wherein the seating unit moves between a first position where the image sensor packages are to be seated and a second position where the image sensor packages are tested, and the controlling and processing unit further comprises a handler module for controlling carrying, aligning, and positioning of the image sensor packages.

14. The apparatus as claimed in claim 13, further comprising a plurality of cassettes on which the image sensor packages are to be loaded, and a carrying unit for carrying the image sensor packages while moving between the cassettes and the seating unit at the first position.

15. The apparatus as claimed in claim 14, wherein a plurality of image sensor packages are seated on a tray, and each of the cassettes comprises a cassette body in which the tray is loaded, and an elevator for raising and lowering the tray.

16. The apparatus as claimed in claim 13, wherein the seating unit comprises a pair of seats on which the image sensor packages are to be seated, and a rotary arm installed rotatably and having the pair of seats disposed at opposite ends thereof, and the image sensor package is carried to the first or second position by means of the rotation of the rotary arm.

17. The apparatus as claimed in claim 14, wherein the carrying unit comprises a carrying guide installed to be movable in a right and left direction, a package picker mounting portion mounted on the carrying guide so as to be movable in a fore and aft direction, and a package picker unit mounted on the package picker mounting portion so as to be movable in a vertical direction, and wherein the package picker unit comprises a package picker for grasping a sensor.

18. The apparatus as claimed in claim 17, wherein a tray picker for grasping an empty tray is mounted on a front surface of one side of the carrying guide so as to be movable in a vertical direction.

19. The apparatus as claimed in claim 17, further comprising an aligning camera for photographing a bottom surface of each of the image sensor packages, wherein the package picker unit comprises a rotating means for rotating the package picker about a vertical axis.

* * * * *